United States Patent
Baker

(10) Patent No.: US 7,459,962 B2
(45) Date of Patent: Dec. 2, 2008

(54) TRANSIENT SIGNAL DETECTION ALGORITHM USING ORDER STATISTIC FILTERS APPLIED TO THE POWER SPECTRAL ESTIMATE

(75) Inventor: James B Baker, Renton, WA (US)

(73) Assignee: The Boeing Company, Chicago, IL (US)

( * ) Notice: Subject to any disclaimer, the term of this patent is extended or adjusted under 35 U.S.C. 154(b) by 56 days.

(21) Appl. No.: 11/493,256

(22) Filed: Jul. 26, 2006

(65) Prior Publication Data

US 2008/0024207 A1  Jan. 31, 2008

(51) Int. Cl.
*H03K 5/00*  (2006.01)
(52) U.S. Cl. ...................... 327/551; 327/552
(58) Field of Classification Search ......... 327/551–558; 704/201, 206
See application file for complete search history.

(56) References Cited

U.S. PATENT DOCUMENTS

| | | | | |
|---|---|---|---|---|
| 4,809,339 A | * | 2/1989 | Shih et al. | 381/110 |
| 5,133,013 A | * | 7/1992 | Munday | 704/226 |
| 5,319,583 A | * | 6/1994 | Wildes | 708/303 |
| 6,738,436 B1 | | 5/2004 | Harres | |
| 6,885,504 B2 | | 4/2005 | Hall et al. | |
| 6,940,896 B2 | | 9/2005 | Mandell et al. | |
| 7,277,554 B2 | * | 10/2007 | Kates | 381/316 |
| 2005/0278171 A1 | * | 12/2005 | Suppappola et al. | 704/227 |

* cited by examiner

*Primary Examiner*—Dinh T. Le
(74) *Attorney, Agent, or Firm*—Harness, Dickey & Pierce, P.L.C.

(57) ABSTRACT

A non-linear, order-statistic filter that is able to detect transients within an ambient signal environment without the transients affecting the setting of the transient detection threshold. The filter obtains a power spectral estimate (PSE) signal for each one of a plurality of predetermined bandwidth portions of the ambient input signal. Specific PSE magnitude values making up the PSE signal are sorted and ordered from smallest to largest. An average PSE magnitude value is obtained for a preselected center range of the specific PSE magnitude values, and this value is used to set the transient signal detection threshold for the filter.

17 Claims, 4 Drawing Sheets

TRANSIENT SIGNAL DETECTION ALGORITHM USING ORDER STATISTIC FILTERS APPLIED TO THE POWER SPECTRAL ESTIMATE

TECHNICAL FIELD

The present application relates to signal filtering systems, and more particularly to a non-linear, order-statistic filter applied to a power spectral estimate of an ambient signal environment that is able to set a transient signal detection threshold based on a background noise level, and further in a manner in which the transient signal detection threshold is not influenced by transient signals being detected by the filter.

BACKGROUND

The statements in this section merely provide background information related to the present disclosure and may not constitute prior art.

Filters that are used to detect narrow band transient signals often must operate in a signal environment to detect the transient signals (e.g., acoustic, radio frequency, etc.) where the center frequency of the transient signal is not known a priori, and where the transient signal is present in a broadband frequency spectrum being monitored by the filter. Often, the signal environment also includes a non-uniform, varying noise floor, and also long-duration signals such as continuous wave (CW) and broadcast signals (e.g., FM, TV). The objective is to detect the transient signals without providing false detections due to variations in the background noise level, and/or due to the presence of the long-duration signals. Conventional techniques often employ linear averaging filters to set detection thresholds, but such filters provide no discrimination based upon a signal's duration. Linear, averaging filters typically average the total energy of a signal within a particular frequency band. Thus, high-energy transient signals and long-duration, low-power continuous wave signals are treated the same by these linear types of filters.

Typically, to detect a transient signal, a power spectral estimate (PSE) of the ambient signal environment is computed, from which an adaptive detection threshold is derived via a linear, low-pass filter. This detection threshold is placed above the noise level so that the noise rarely exceeds the detection threshold. However, when the detection threshold is exceeded by the PSE, a transient signal detection is declared by the filter.

It would be highly desirable if the transient detection threshold of the filter could be set to remain above the background noise level, and also above the level of long-duration signals like continuous wave signals, so that neither background noise nor long-duration signals are detected by the filter as transient signals. It is also desirable that the threshold remain at a level consistent with (but slightly above) the ambient noise level, and below the level of any transient signals that occur, so that the transient signals will be detected.

Thus, what is required is a filter that allows its transient signal threshold to operate without being influenced (i.e., being changed in threshold level) by the signals which the filter is trying to detect, namely transient signals. This is a limitation with present day linear filters. Due to the nature of a linear filter, such as that described above, the detection threshold of such a filter is based upon the average signal power being detected by the filter, regardless of whether the signal is a continuous wave signal or a transient signal. Although one can reduce the affect the transient signals have on a linear, low-pass filter's output by lowering the cutoff frequency, doing so introduces the additional problem of long settling times required when setting the threshold level.

Thus, it would be highly desirable to provide a filter able to operate within a broadband ambient environment, in which transient signals reside, and which provides a scanning process which adapts to changes in the signal environment to detect transient signals without false detections from long-duration signals and/or variations in the background noise level of the ambient signal being monitored, and without having its detection threshold influenced by the transient signals.

SUMMARY

The present disclosure relates to a method and system for detecting transient signals, where the transient signals do not affect the transient signal detection threshold determined by the system.

In one implementation, a power spectral estimate (PSE) signal is determined over at least a predetermined bandwidth portion of an input signal being received by the system. The PSE signal includes background noise present in the input signal that forms a noise floor for the input signal. The PSE signal may also include long duration, continuous wave signal components. The predetermined bandwidth portion is a bandwidth generally selected in accordance with the bandwidth of a transient signal to be detected.

The PSE signal is analyzed over the predetermined bandwidth portion to obtain an average magnitude value for the PSE signal within a preselected portion or range of the predetermined bandwidth portion. The average magnitude value is then used to set a transient detection threshold so that transients present in the predetermined bandwidth of the PSE signal that fall above the transient detection threshold, are detectable without such transients influencing the setting off the transient detection threshold.

In one implementation, determining the preselected portion of the predetermined bandwidth includes defining a center bandwidth portion of the predetermined bandwidth portion, and determining the average magnitude value of the PSE signal within the center bandwidth portion. In another implementation, analyzing the PSE signal involves ordering PSE magnitude values comprising the PSE signal from smallest to greatest, prior to determining the average magnitude value of the PSE signal within the center bandwidth portion.

The system and method enables transients to be detected within a signal having a varying noise floor and long-duration, continuous wave signals, without the transient themselves influencing the setting of the transient detection threshold.

Further areas of applicability will become apparent from the description provided herein. It should be understood that the description and specific examples are intended for purposes of illustration only and are not intended to limit the scope of the present disclosure.

BRIEF DESCRIPTION

The drawings described herein are for illustration purposes only and are not intended to limit the scope of the present disclosure in any way.

FIG. 1 is a diagram illustrating how an ambient signal environment is divided in to a plurality of distinct frequency bandwidth portions or "bins" in which a power spectral estimate (PSE) signal is obtained for each bandwidth portion, and where the power spectral estimate signal for each bandwidth portion is fed into an associated filter constructed in accordance with the teachings of the present disclosure;

FIG. 6 is a diagram illustrating a detection circuit which indicates when a transient signal has been detected.

DETAILED DESCRIPTION

Figure 1:
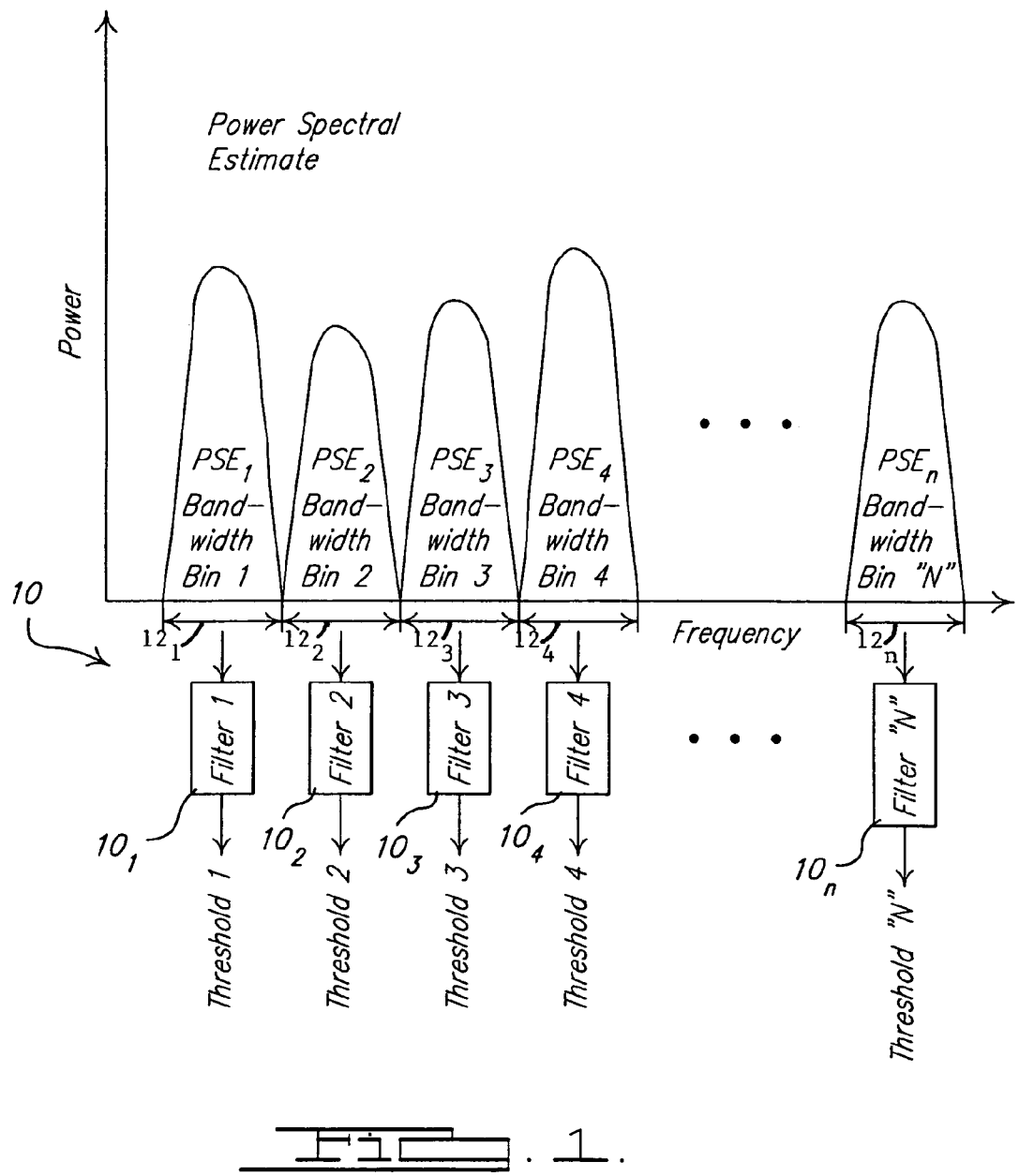

The following description is merely exemplary in nature and is not intended to limit the present disclosure, application, or uses. It should be understood that throughout the drawings, corresponding reference numerals indicate like or corresponding parts and features.

Referring to FIG. 1, an implementation of the present system 10 is illustrated in which a plurality of filters $10_1$-$10_n$ are used to receive power spectral estimate signals $PSE_1$-$PSE_n$ for predetermined bandwidth portions of the ambient input signal being monitored. Thus, $PSE_1$ represents a first bandwidth portion (i.e., "bin" or "window") of frequencies within which energy is captured, with the curvature of the window defining the weighting that is applied to the signals at specific frequencies within the window. The window's curvature is determined by the method of performing the Power Spectral Estimate from the input time signal, and may be the Fourier transform of the time window chosen for computing the PSE from the time window. Typical time windows are the Hamming, Hanning, Blackman and Bartlett windows. Specialized time windows are also possible. Also, it may be desirable to choose the curvature and widths of the predetermined bandwidth portions so that they overlap in frequency by some amount.

Similarly, $PSE_2$ represents the power spectral estimate signal for a contiguous second predetermined bandwidth portion of the ambient input signal, and so forth. The power spectrum of an exemplary ambient input signal itself is shown as waveform 72 in FIG. 5.

The specific bandwidth for each predetermined bandwidth portion is set in accordance with the bandwidth of the transient to be detected by the system 10. For example, if transients having a bandwidth of 10 KHz are being monitored, then each bandwidth portion $12_1$-$12_n$ will have a bandwidth of approximately 10 KHz. Each filter $10_1$-$10_n$ thus operates to monitor and analyze a specific, predetermined bandwidth portion of the ambient input signal. Each filter $10_1$-$10_n$ uses the PSE signal that it receives to determine a transient signal detection threshold for that specific predetermined bandwidth portion. If a transient is received in the ambient input signal in, for example, predetermined bandwidth portion $12_2$, then filter $10_2$ would report the detection of the transient. The filters $10_1$-$10_n$ are arranged to receive the PSE signals in parallel, and thus can operate simultaneously to provide detection of transients over a desired frequency spectrum. Each filter $10_1$-$10_n$ contains a non-linear, order-statistic filter that is not influenced by the presence of transients themselves. This will be explained further in the following paragraphs.

Figure 2:
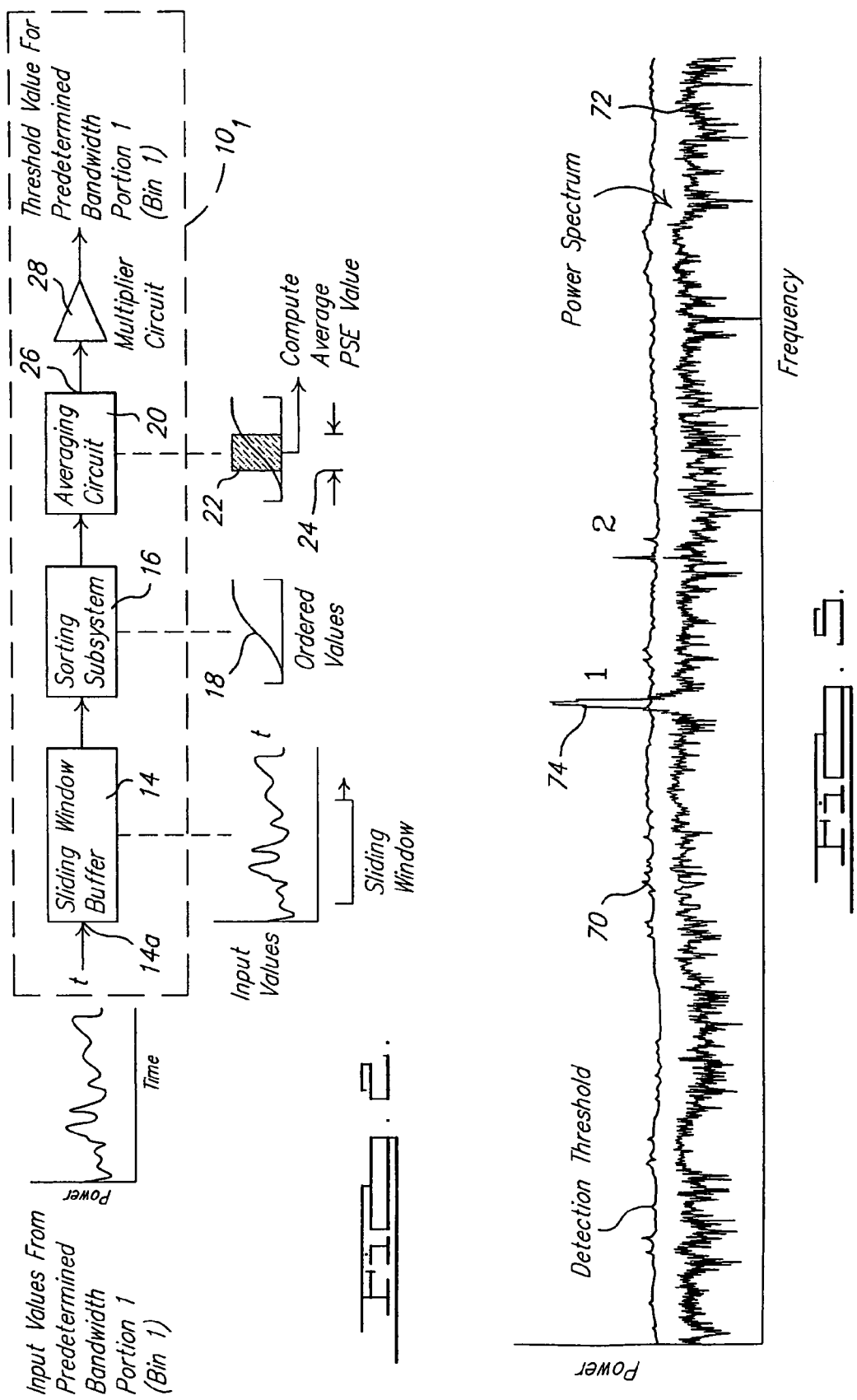
FIG. 2 is a block diagram illustrating one implementation of the filter of the present disclosure, together with waveform diagrams illustrating the signal being acted on by each component of the filter.

Referring to FIG. 2, an exemplary construction of one of the filters $10_1$ is illustrated. It will be appreciated that filters $10_1$-$10_n$ are each preferably of identical construction, and therefore only the construction of filter $10_1$ will be described.

Filter $10_1$ receives the $PSE_1$ signal for predetermined bandwidth portion $12_1$ of the ambient input signal on an input $14a$ of a sliding window buffer 14. The sliding window buffer 14 generates a plurality of specific PSE magnitude values for specific "time window" segments of the $PSE_1$ signal. These power magnitude values are transmitted to a sorting subsystem 16. The sorting subsystem 16 sorts the PSE magnitude values and orders them from smallest to largest into a set or ordered values, as indicated by curve 18. The operation of the sliding window buffer 14 will be described in greater detail momentarily.

Next, an averaging circuit receives the ordered values from the sorting subsystem 16 and determines an average PSE magnitude value 22 for a preselected center range 24 of the first predetermined bandwidth portion $12_1$. This is accomplished by discarding the specific PSE magnitude values from the buffer 14 that fall outside the preselected center range 24. It will be appreciated that the specific PSE magnitude values will each be represented by positive real numbers (e.g., 3, 7.6, 9.2, 11, etc). Only those values falling within the preselected center range 24 of the overall range of ordered values are used in determining the average PSE magnitude value. Thus, the average PSE magnitude value represents the average power spectral estimate over a predetermined range, and more preferably over approximately the center 20% to 40% of the range of specific PSE magnitude values supplied by the sliding window buffer 14, and still more preferably over the central one-third range of the predetermined bandwidth portion $12_1$. However, the precise range selected will vary based on the specific needs of a particular application. Finally, the average PSE magnitude value 22 is output from 26 of the averaging circuit 20 into a multiplier 28 where it is multiplied (i.e., scaled) to produce a scaled, average PSE magnitude value that is used to set the transient threshold detection value for the predetermined bandwidth portion $12_1$.

Figure 3:
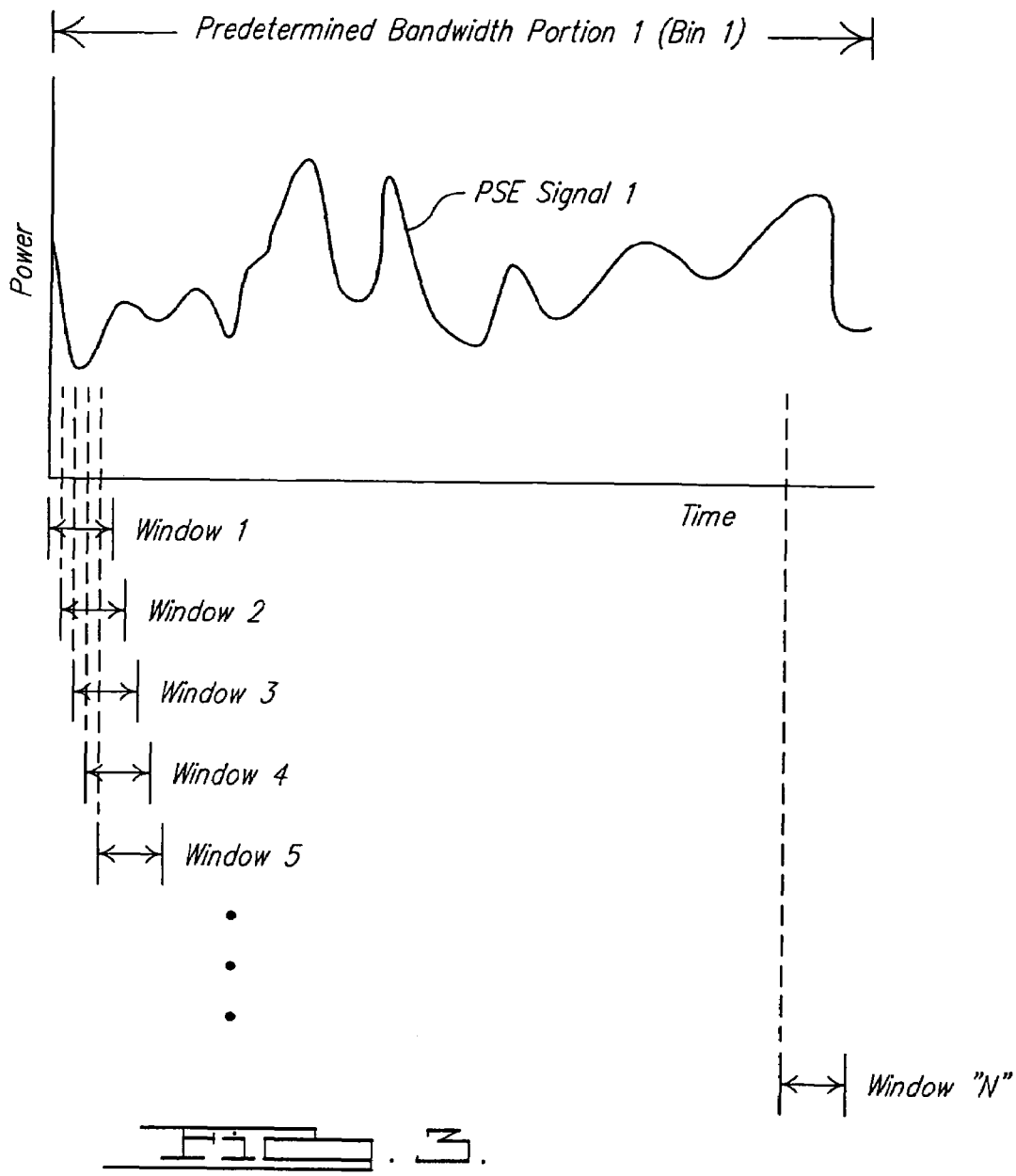
FIG. 3 is a diagram illustrating the basic operation of the sliding window buffer in FIG. 2.

With brief reference to FIG. 3, additional description of the operation of the sliding window buffer 14 will be provided. The sliding window buffer 14 is a well known form of buffer that takes a series of "time window" segments or "time slices" of an input signal having a predetermined overall duration. Exemplary time windows are illustrated in FIG. 3. The time windows may vary in duration, depending on the range of durations of the transient signals being detected, and depending on the size of the predetermined bandwidth portions 12 that have been selected. Preferably the time windows overlap slightly, although this is not absolutely necessary. Each time window defines a time segment during which specific PSE magnitude values of the overall PSE signal are obtained, buffered, and then transmitted to the sorting subsystem 16. The specific magnitude values are transmitted to the sorting subsystem 16 sequentially. They may each be transmitted either immediately after they are obtained, or they can all be transmitted sequentially as part of a group after the sliding window buffer 14 has acquired all of the specific magnitude values for predetermined bandwidth portion $12_1$. Either way, the sorting subsystem 16 receives a serial stream of specific, PSE magnitude values that each represent a small portion of the PSE signal over the predetermined bandwidth portion $12_1$.

It will be appreciated, then, that sorting subsystem 20 operates to generate an average PSE magnitude value from the group of specific PSE magnitude values that are supplied from the sliding window buffer 14 for each sampling cycle. Since the process of obtaining the average PSE magnitude values involves discarding those values that fall outside the preselected center range 24, those specific PSE magnitude values that might be the result of transients themselves, whose power exceeds that of the background noise, are removed from the process by which the transient detection threshold is being set. More specifically, they are removed from the group of specific PSE magnitude values that are used to formulate the average PSE magnitude value. As a result, they do not influence the determination of the transient detection threshold.

As a simple example, consider that 10 different specific magnitude values (e.g., 7, 4, 90, 8, 3, 6, 2, 1, 100, and 5, in this particular order) are output from the sliding window buffer 14 to the sorting subsystem 16. The sorting subsystem 16 sorts and orders these specific PSE magnitude values as 1, 2, 3, 4, 5, 6, 7, 8, 90 and 100 (i.e., from smallest to largest). The averaging circuit 20 will take this ordered group of specific PSE magnitude values and discard those that fall outside the preselected center range (range 24 in FIG. 2). In this example, the approximate center one-third magnitude of the range would comprise the specific magnitude values of 5, 6, and 7. Thus, the specific PSE magnitude values of 1, 2, 3, 4, 8, 90 and 100 would be discarded. The averaging circuit 20 would then average the specific magnitude values 5, 6 and 7 to obtain an average PSE magnitude value of "6". It is this value that forms the average PSE magnitude value. Hence, the relatively large values of 90 and 100, which may be the result of short-duration, high energy transients, will have no affect on the computed average. In this example the value "6" is then provided to the multiplier circuit 28 to produce the scaled, average PSE magnitude value that is used to set the transient detection threshold for the predetermined bandwidth portion $12_1$.

Note that if large PSE magnitude values (such as 90 and 100 in the example above) were to be persistent, they would cause the center range 24 of the averaging circuit 20 to eventually fill with large values, thus affecting the circuit's average output value, and subsequently affecting the transient detection threshold. However, such long duration signals, such as continuous wave signals, that are causing the large values to be persistent are not transient signals. So averaging circuit 20 has the desirable attribute that, for this case, the transient detection threshold will increase to a level greater than the level of the long duration signal, so that the long duration signal will not be detected as a transient signal.

By only using the preselected center range 24 of specific PSE magnitude values, the average PSE magnitude value will always remain above the noise floor of the ambient input signal, but will not be influenced by transients that show up as brief, large specific PSE magnitude values in the output of the sliding window buffer 14, which values would be markedly greater in magnitude than the smaller PSE noise floor values in a given group being analyzed by the averaging circuit 20. However, if the noise floor should begin increasing in magnitude, the detection threshold will be caused to track (but stay above) the noise floor as the groups of specific PSE magnitude values analyzed by the averaging circuit 20 become gradually larger in magnitude. Conversely, if the noise floor begins to drop, each group of specific PSE magnitude values analyzed by the averaging circuit 20 will gradually become smaller in overall magnitude, which will cause the average PSE magnitude value to drop as well, but again to remain above the noise floor. As a result, the transient detection threshold will remain above the level of the noise floor and above the level of long duration signals, but yet remain below the level of short-term transient signals.

Figure 4:
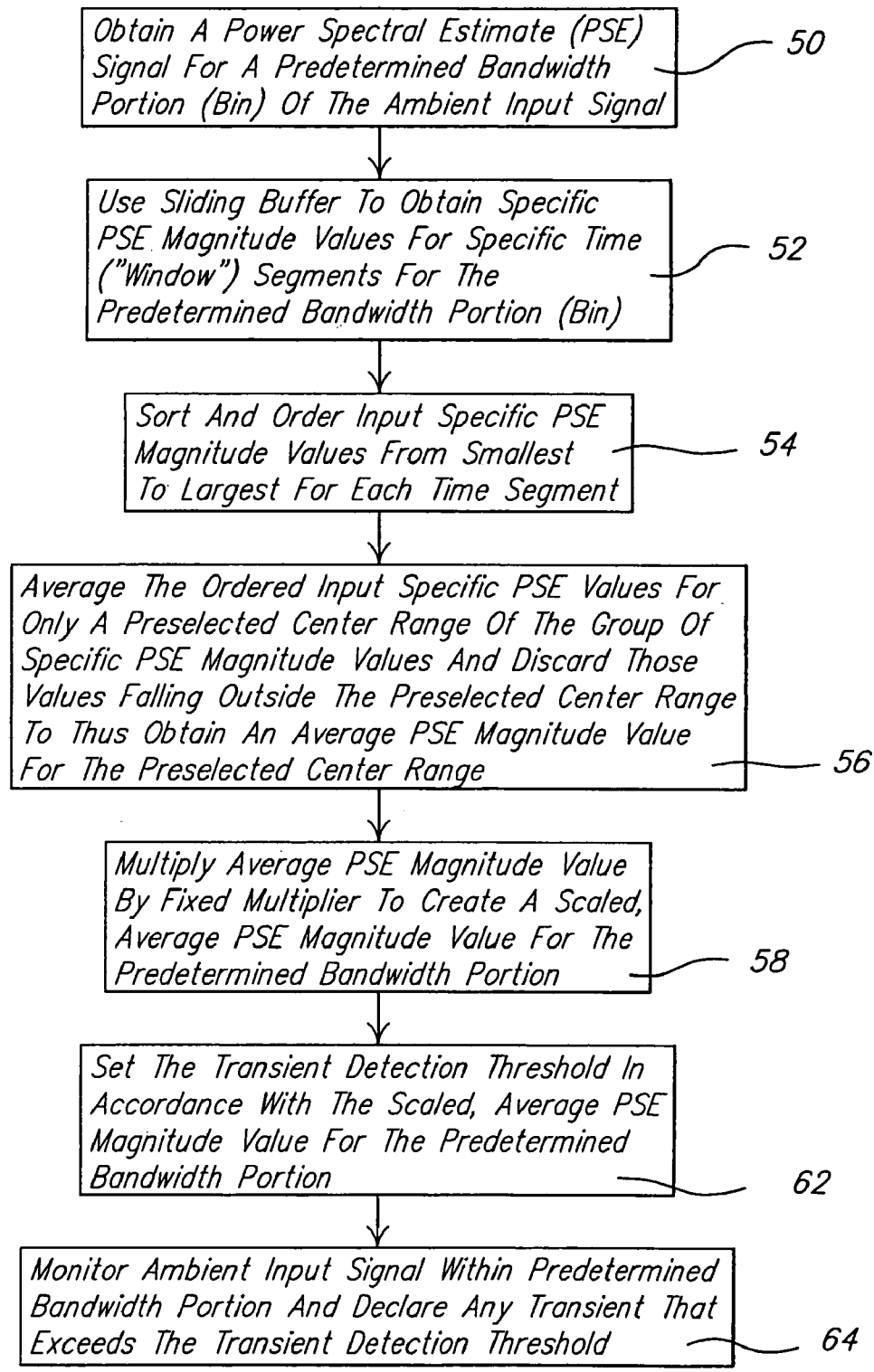
FIG. 4 is a flowchart setting forth the basic operations of one implementation of the present disclosure.

The operation of the system 10 can be further seen in connection with the flowchart of FIG. 4. At operation 50, the input values making up the PSE signal for the predetermined bandwidth portion $12_1$ of the ambient input signal (72, FIG. 5) are obtained. In operation 52, the input values obtained are analyzed and buffered using the sliding window buffer 14 to generate specific PSE magnitude values. These values are sequentially transmitted to the sorting subsystem 16. In operation 54, the specific PSE magnitude values are sorted and ordered by the sorting subsystem 16 from smallest to largest in magnitude. In operation 56, the averaging circuit 26 obtains the average PSE magnitude value of the ordered specific PSE magnitude values for only the-preselected center range 24 of the magnitude values being analyzed, to thus obtain an average PSE magnitude value for those values falling within the center range 24. In operation 58, the average PSE magnitude value obtained in operation 56 is multiplied by multiplier 28 to produce a scaled, average PSE signal value. In operation 60, the transient detection threshold is set in accordance with the scaled, average PSE magnitude value obtained at operation 58. In operation 62, the ambient input signal is monitored within the predetermined bandwidth portion $12_1$, giving $PSE_1$, and if $PSE_1$ exceeds the transient detection threshold, then a transient signal is declared for bandwidth portion $12_1$. The filters $10_1$-$10_n$ may sample the ambient input signal at a predetermined time interval, for example every one second, every one microsecond, or at any other time interval depending on the application. The optimum sampling interval will vary based on the frequency of the ambient input signal, as well as the nature of the transients being detected. Input signals in the kilohertz range will typically require less frequent sampling than signals in the megahertz or gigahertz ranges.

The system 10 has the significant advantage that its transient detection threshold is not influenced by the transient themselves. By determining an average PSE signal magnitude value for a preselected center portion, for each predetermined bandwidth portion of the ambient signal, transients can be monitored and detected within each predetermined bandwidth portion of the ambient input signal. As the average PSE magnitude value for a given predetermined bandwidth portion changes, for example, because the noise floor is changing, the system 10 is able to recalculate a new average PSE magnitude value so that the transient detection threshold will always remain above the noise floor, as well as above long-duration, continuous wave signals of a given bandwidth portion of the ambient input signal. As long as the transient signal ceases before its associated PSE magnitude value(s) begin filling in the preselected center portion of the ordered, specific PSE magnitude values, then the transient signal will have no affect on the filter $10_1$ output (i.e., will not influence the transient detection threshold of the filter $10_1$).

Figure 5:
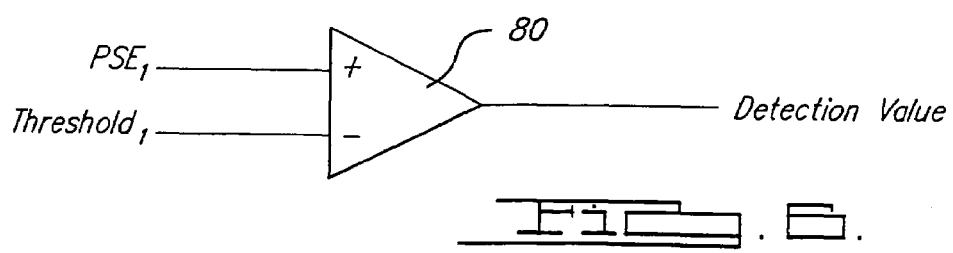
FIG. 5 is a graph illustrating a transient detection threshold, an ambient input signal, and a transient being detected.

Referring briefly to FIG. 5, a graph illustrating an exemplary detection threshold 70 and the ambient input signal 72 having a transient is shown. The detection threshold 70 stays above the ambient input signal 72 except when a transient 74 exceeds the detection threshold 70. It will be noted that the detection threshold 70 is not altered in magnitude after the transient 74 (i.e., is not altered in magnitude at the frequency of transient 74 in FIG. 5).

Referring briefly to FIG. 6, a diagram illustrating a detection circuit 80 which indicates when a transient signal has been detected. When the value of the input PSE1 exceeds the value of the input Threshold 1, the output Detection Value assumes the value of being logically true, indicating that a transient detection has occurred. Otherwise, the output Detection Value assumes the value of being logically false, indicating that no transient detection has occurred.

What is claimed is:

1. A method for forming a filter for detecting transients in an input signal, in which a transient detection threshold of said filter is not influenced by the presence of transients in said input signal, the method comprising:

determining a power spectral estimate (PSE) signal of at least a predetermined bandwidth portion of said input signal, the PSE signal including background noise forming a noise floor for said input signal, and the predetermined bandwidth portion of said input signal having a bandwidth that is generally in accordance with a bandwidth of a transient signal to be detected;

using a sorting subsystem and an averaging circuit to analyze said PSE signal over said predetermined bandwidth portion to obtain an average PSE magnitude value for said PSE signal within a preselected portion of said predetermined bandwidth; and using said average PSE magnitude value for a transient detection threshold, so that said transients present in said predetermined bandwidth portion of said input signal that have a magnitude above said transient detection threshold are detectable without influencing said transient detection threshold.

2. The method of claim 1, wherein said analyzing said PSE signal over said predetermined bandwidth portion of said input signal comprises:

obtaining a set of varying, specific PSE magnitude values representing the magnitude of said PSE signal at specific frequencies within said predetermined bandwidth portion, and using said varying, specific magnitude PSE values to determine said average PSE magnitude value.

3. The method of claim 1, wherein analyzing said predetermined bandwidth portion of said input signal further comprises:

defining a center range based on a group of specific PSE magnitude values obtained; and determining said average PSE magnitude value using only ones of said specific PSE magnitude values that fall within said center range.

4. The method of claim 3, wherein said defining a center range comprises defining an approximate center one-third range of an overall magnitude range of said specific PSE magnitude values.

5. The method of claim 3, wherein said defining a center range comprises defining an approximate center 20% to 40% range of an overall magnitude range of said specific PSE magnitude values of said predetermined bandwidth portion.

6. The method of claim 2, wherein said analyzing said predetermined bandwidth portion further comprises ordering said set of varying, specific PSE magnitude values from smallest to largest.

7. A method for forming a filter for detecting transients in an input signal, in which a transient detection threshold of said filter is not influenced by the presence of transients in said input signal, the method comprising:

determining a power spectral estimate (PSE) signal over at least a predetermined bandwidth portion of said input signal, the PSE signal including background noise forming a noise floor for said input signal, and the predetermined bandwidth portion of said input signal having a bandwidth generally in accordance with a bandwidth of a transient signal to be detected;

analyzing said PSE signal over said predetermined bandwidth portion to obtain a set of time varying, specific PSE magnitude values representing the magnitude of said PSE signal at specific frequencies within said predetermined bandwidth portion;

using a sorting subsystem and an averaging circuit to determine an average PSE magnitude value from said specific PSE magnitude values using a subset of said specific PSE magnitude values; and using said average PSE magnitude value for a transient detection threshold for said filter.

8. The method of claim 7, wherein said using a subset of said specific PSE magnitude values comprises using approximately a center one-third magnitude range of said specific PSE magnitude values.

9. The method of claim 7, wherein said using a subset of said specific PSE magnitude values comprises using approximately a center 20% to 40% of the range of said specific PSE magnitude values.

10. The method of claim 7, wherein said analyzing said analyzing said PSE signal over said predetermined bandwidth portion further comprises ordering said set of specific PSE magnitude values from smallest to largest.

11. The method of claim 7, further comprising multiplying said average PSE magnitude value by a predetermined factor to produce a scaled, average PSE magnitude value, and then setting said transient detection threshold in accordance with said scaled, average PSE magnitude value.

12. The method of claim 7, comprising dividing said input signal into a plurality of different, predetermined bandwidth portions, and generating a plurality of separate PSE signals for each one of said different, predetermined bandwidth portions.

13. The method of claim 12, further comprising analyzing said different, predetermined bandwidth portions of said input signal independently from one another.

14. A filter for detecting transients in an input signal, in which a transient detection threshold of said filter is not influenced by the presence of transients, said filter comprising:

a buffer for receiving and temporarily storing a power spectral estimate (PSE) signal representing a power spectral estimate of a predetermined bandwidth portion of said input signal, said predetermined bandwidth portion corresponding to an approximate frequency bandwidth of a transient signal to be detected; and a sorting subsystem and an averaging circuit, responsive to said buffer, for analyzing said PSE signal and determining an average PSE magnitude value for said PSE signal, and said average PSE magnitude value forming a transient signal detection threshold for said filter, so that said transient signal appearing in said input signal that exceed said average PSE magnitude value can be detected without influencing said transient signal detection threshold.

15. The filter of claim 14, wherein said sorting subsystem:

generates a plurality of specific PSE magnitude values at various frequencies over said predetermined bandwidth portion, and ordering said specific PSE magnitude values from smallest to largest.

16. The filter of claim 15, wherein said averaging circuit is adapted to receive said specific PSE magnitude values from said sorting subsystem and determine said average PSE magnitude value from a predetermined central range of said specific PSE magnitude values.

17. The filter of claim 16, further comprising a multiplier for multiplying said average PSE magnitude value by a multiplier to obtain a scaled, average PSE magnitude value, the scaled, average PSE magnitude value being used to set said transient signal detection threshold.

* * * * *